United States Patent [19]

Yoo

[11] Patent Number: 4,523,434
[45] Date of Patent: Jun. 18, 1985

[54] AIR VENTILATOR

[76] Inventor: Byung E. Yoo, #616-5, Daemyung-dong, Nam-ku,, Daegu-si, Rep. of Korea

[21] Appl. No.: 647,525

[22] Filed: Sep. 5, 1984

[30] Foreign Application Priority Data

Jan. 14, 1984 [KR] Rep. of Korea .................. 84-281
Mar. 2, 1984 [KR] Rep. of Korea .................. 84-1740

[51] Int. Cl.$^3$ ............................................. F23J 25/08
[52] U.S. Cl. ..................................... 62/116; 415/33; 415/129; 416/54
[58] Field of Search ................... 98/116; 415/21, 33, 415/129; 416/54

[56] References Cited

U.S. PATENT DOCUMENTS

| | | | |
|---|---|---|---|
| 2,383,001 | 8/1945 | Mader | 415/129 |
| 2,383,002 | 8/1945 | Mader | 415/129 |
| 3,589,267 | 6/1971 | Hosono et al. | 98/116 |

Primary Examiner—Ronald C. Capossela
Attorney, Agent, or Firm—Birch, Stewart, Kolasch & Birch

[57] ABSTRACT

An air ventilator for ventilating indoor air to the environment comprising a motor provided with a shaft, a rotor mounted on said shaft, a plurality of fan blades pivotally attached to the rotor, a rotating circular plate having a plurality of sliding slots and a plurality of connecting holes mounted on said shaft of the motor, a fixed circular plate connected to the rotating circular plate with pins and mounted on the shaft of said motor, centrifugal weight members disposed between the fixed circular plate and the rotating circular plate, and a torsion coil spring connecting the centrifugal weight member with the rotating circular plate for elastically supporting the weight member, whereby when the motor is operating, the centrifugal weight members engage the rotating circular plate, apply a circumferential directional force thereto, and angularly displace the circular plate, said displacement being transmitted to the fan blades for ventilating the inside air to the environment; and when the motor is not operating the centrifugal weight members return to their original position by the torsion coil spring, thereby closing all air-passages between the fan blades.

4 Claims, 5 Drawing Figures

AIR VENTILATOR

FIELD OF THE INVENTION

The present invention relates to an air ventilator, and more particularly to an air ventilator which can fully close the air passage from the outside with the variable pitch of the fan blades when it is not operating and which opens the air passage with the fan blades according to the revolutionary speed of the motor.

BACKGROUND OF THE INVENTION

Generally, an air ventilator is actuated as a contrary concept to an electric fan and must be located at an opening which leads to the outside, because a ventilator is intended to purify the interior of a room by drawing out the turbid air therefrom. However, since a ventilator is located at an opening which leads to the outside, worms or dirty air tends to flow backward through and between the ventilator blades. To solve these disadvantages, a device having blades for blocking the air-passage has been provided. However these prior art devices also have many disadvantages such as increased stream friction of the air by the blades disposed in front of the air-passage and a reduction in air ventilation efficiency. As a result, the air ventilator device must be operated for long periods of time and it is necessary to block the air-passage when it is not operating by a separate means like a blade.

SUMMARY OF THE INVENTION

The present invention solves the problems associated with the prior art air ventilator devices as well as other devices by providing a new and useful air ventilator having variable pitch blades.

In view of the foregoing, it will be obvious that one aspect of the present invention is to provide an air ventilator which can fully close the air-passage with the adjacent blades coming in contact with each other when the ventilator is not operating and open the air-passage with the angular displacement of the blades caused by the centrifugal force of the rotating blades.

It is another object of the present invention to provide a device for the air ventilation of indoor air utilizing variable pitch blades which vary according to the revolutionary speed of the motor on the ventilator.

It is a further object of the present invention to provide an air ventilator which has no separate means to close the airpassage but solves this and related problems by itself.

In accordance with the above objects of the present invention, there is provided an air ventilator comprising a motor for rotating fan blades, said motor being fixed on the frame of a case of the device. A rotor is mounted on the shaft of the motor with a fixed key and a rotating circular plate having sliding slots and a plurality of connecting holes is mounted on the shaft of the motor. A fixed circular plate which is connected to the rotating plate with pins is mounted on the shaft of the motor. A head cap is screwed on the motor shaft over the fixed circular plate supporting the above fixed circular plate and over the rotating circular plate to the said rotor. Two centrifugal weight members are located between the fixed circular plate and the rotating circular plate, and turned around the pin of the fixed circular plate and coupled with the sliding hole through a guide protrusion which protrudes from the centrifugal weight member and is elastically supported by a spring. A plurality of blades are pivotally linked with the rotor through a turning link which is mounted on the shaft of the fan blade and connected to the connecting hole of the rotating circular plate through the pin of the turning link.

The air ventilator, in corresponding with the present invention, includes a casing for carrying a motor disposed in a frame. A rotor is mounted on the shaft of the motor. The fan blades are pivotally joined to the rotor through a turning link. The rotating circular plate including sliding slots and a plurality of holes formed thereon and centrifugal weight elements which can be turned around the pin connecting the fixed circular plate with the rotating circular plate are mounted on the shaft of the motor and fixed with the head cap, and all are rotated together according to the rotation of the shaft of the motor.

In addition, the centrifugal weight element which is supported by a coil spring and is pivotally mounted on the rotating circular plate slides along the sliding slot with the aid of a guide protrusion which is formed on the weight element and extends into said slot. Because the pin of the turning link carried on the shaft of the fan blade is disposed in the connecting hole of the rotating circular plate, as the shaft of the motor rotates, the centrifugal weight elements, which are adjacent to the shaft of the motor, rise toward the outside of the rotating circular plate.

As the guide protrusion which protrudes from the lower part of the centrifugal weight element slides along the sliding slot of the rotating circular plate, the rotating circular plate is displaced to a certain angular degree. That is, the rotating circular plate is angularly displaced by the moment generated by the two guide protrusions of the centrifugal weight element.

As the rotating circular plate is angularly displaced, the pin of the turning link of the fan blade, which is inserted into the connecting holes formed along the circumferential surface of the rotating circular plate angularly displaces the fan blade. That is, as the shaft of the motor rotates, the rising displacement of the centrifugal weight member, which is generated by the centrifugal force, angularly displaces the rotating circular plate.

Therefore, when not operating, the fan blades contact each other to close the air-passage, but when it is operating, the fan blade has an angle of pitch against the surface of rotation which operates to ventilate the indoor dirty air. Of course, if the switch is turned off, the centrifugal force of the weight member is gradually decreased and the fan blade returns to the first position with the restitutional force of the coil spring and closes the air-passage.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENT

Figure 1:
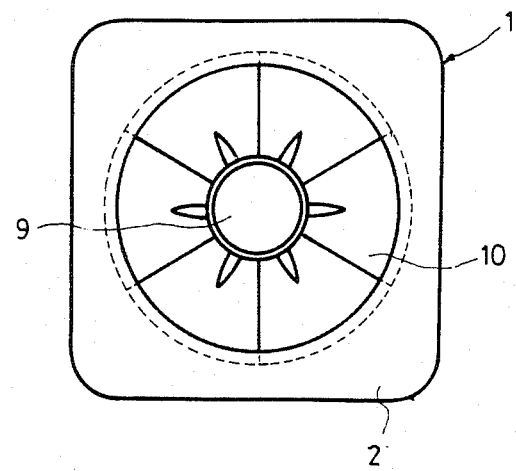
FIG. 1 shows a front elevational view of the preferred embodiment of the air ventilator in accordance with the present invention.

Referring now to the drawings, FIGS. 1–4 show the air ventilator 1 having a case 2 and a motor 3 supported by a frame 4 at the center of the case 2.

A rotor 5, a rotating circular plate 6 and a fixed circular plate 7 are mounted in turn on the shaft 8 of the motor 3, and fixed with the head cap 9.

The rotor 5 having the fan blades 10 pivotally attached to it by a turning link 11 carried on the shaft 12 of the fan blades 10 is fixed in a certain position on the shaft 8 of the motor 3 with a fixed key 13. The rotating circular plate 6 and the fixed circular plate 7 is fixed between the rotor 5 and the head cap 9 which is screwed onto the end of the shaft 8 of the motor 3. But the rotating circular plate 6 is a free fit connection which enables it to turn around the shaft 8 of the motor 3.

Figure 4:
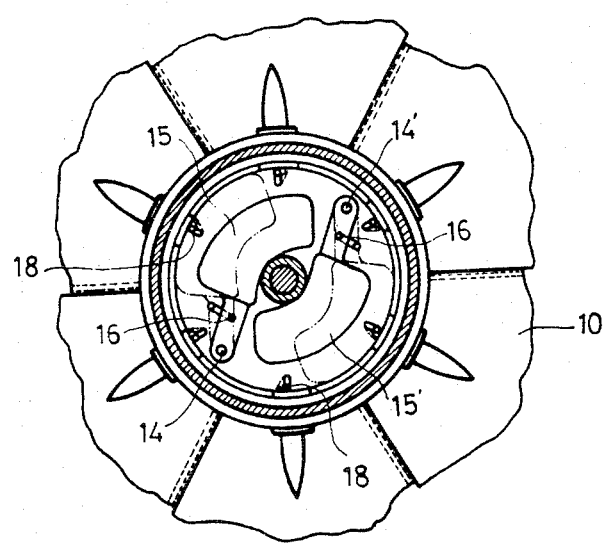
FIG. 4 shows a view taken along the line B—B of FIG. 3.
Figure 5:
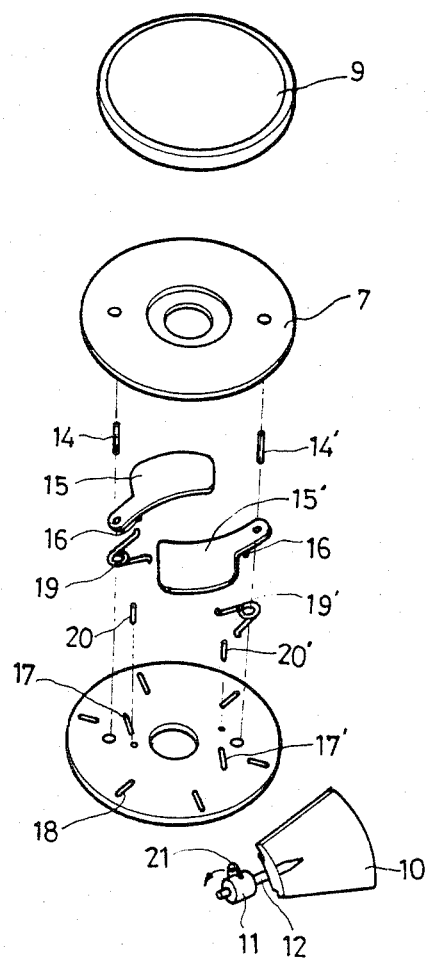
FIG. 5 shows a perspective view of the parts of the fan blade utilized in accordance with the present invention.

The rotating circular plate 6 is connected with the fixed circular plate 7 through pins 14, 14' as shown in FIG. 4. Between the rotating circular plate 6 and the fixed circular plate 7, two centrifugal weight elements 15, 15', including a guide protrusion 16 formed as part of the weight elements are pivotally carried to turn around the pins 14, 14'. On the rotating circular plate 6 two sliding slots 17, 17' corresponding to the guide protrusions 16 of the centrifugal weight elements 15, 15', and a plurality of connecting slots 18 are positioned along the circumferential surface. Between the rotating circular plate 6 and the centrifugal weight member 15, 15', a torsion coil spring 19, 19' is suspended with the holding pin 20, 20'. Thus the centrifugal weight member 15, 15' is elastically supported.

Furthermore, the fan blade 10 is connected with the rotor 5 through the turning link 11 carried on the shaft 12 of the fan blade 10. The link pin 21 is inserted into the connecting hole 18 of the rotating circular plate 6.

The fan blades 10 have optional stream line shapes, but must be of such a shape to come into contact with each other and fully close the air-passage when the fan is stopped.

OPERATION

Figure 2:
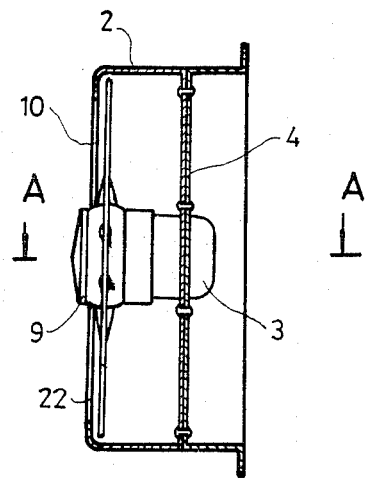
FIG. 2 shows a partial sectional view of the preferred embodiment of the air ventilator in accordance with the present invention.
Figure 3:
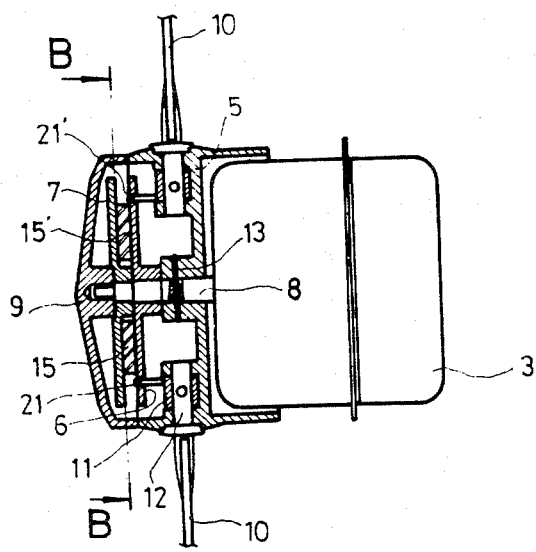
FIG. 3 shows a view taken along the line A—A of FIG. 2.

The operation of the air ventilator according to the present invention will be described with reference to the drawings. When the ventilator 1 is not operating, the fan blades 10 close the air-passage 22 of the case 2 as shown in FIGS. 1 and 2. When the motor 3 is switched on, the rotor assembly including the rotor 5, the circular plates 6, 7 and the head cap 9 are all rotated together with the rotation of the motor-shaft 8. Then the centrifugal weight members 15, 15' between the rotating circular plate 6 and the fixed circular plate 7 rise against the motor-shaft 8 as shown by the dotted line in FIG. 4. As the centrifugal weight members 15, 15' rise against the motor-shaft 8, the guide protrusions 16 on the members 15, 15' extend into the sliding slots 17, 17' of plate 6 and apply a circumferential directional force to the rotating circular plate 6. Then the opposite forces generated from the two members 15, 15' become a couple force and displace the rotating circular plate 6 to a certain angular degree.

The said angular displacement of the rotating circular plate 6 is transmitted to the turning link 11 through the pin 21 of the turning link 11 which is slidably disposed in the connecting slot 18. As a result of this angular actuation, the fan blades 10 assume an angular pitch against the face of the revolution and ventilate the inside air to the environment. When the motor 3 is switched off, as the rotary force of the motor-shaft 8 is decreased and the centrifugal force of the member 15, 15' is also decreased. The centrifugal weight members 15, 15' then return to their original position by means of the restitutional force of the spring 19, 19' which elastically supports the member 15, 15'.

The restorational movement of the centrifugal weight member 15, 15' is transmitted to the fan blades 10 in correspondence to the above described operation, but the operating movement is transmitted to the fan blades 10 with reverse. The springs 19, 19' can be a torsion coil spring with a spring constant sufficient to cause the fan blades to return to their original position when the motor is switched off.

The shape of the fan blade is different from that generally used. However, the type which can close the air-passage without clearance between blades when the ventilator is not operating is used in the device in correspondence with the present invention. The angle of pitch of the fan blade can be adjusted with the length of the sliding holes 17, 17' formed on the rotating circular plate.

Clearly, certain other modifications and improvements could occur to those skilled in the art upon a perusal of the present invention. By way of example, the centrifugal weight members 15, 15' could be magnetic solenoids executed by electrical power or some other means.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An air ventilator for ventilating indoor air to the environment comprising a motor provided with a shaft, a rotor mounted on said shaft, a plurality of fan blades pivotally attached to the rotor, a rotating circular plate having a plurality of sliding slots and a plurality of connecting holes mounted on said shaft of the motor, a fixed circular plate connected to the rotating circular plate with pins and mounted on the shaft of said motor, centrifugal weight members disposed between the fixed circular plate and the rotating circular plate, and a torsion coil spring connecting the centrifugal weight member with the rotating circular plate for elastically supporting the weight member, whereby when the motor is operating, the centrifugal weight members engage the rotating circular plate, apply a circumferential directional force thereto, and angularly displace the circular plate, said displacement being transmitted to the fan blades for ventilating the inside air to the environment; and when the motor is not operating the centrifugal weight members return to their original position by the torsion coil spring, thereby closing all air-passages between the fan blades.

2. The air ventilator of claim 1, further comprising a head cap screwed at the end of the shaft of the motor for fixing the circular plate to the rotor.

3. The air ventilator of claim 1, wherein the rotating circular plate is connected with the fixed circular plate through pins, said centrifugal weight members being pivotally mounted on the said pins and supported by said torsion coil spring.

4. The air ventilator of claim 1, wherein the fan blades are pivotally mounted on the rotor through a turning link carried on its shaft.

* * * * *